United States Patent
Lee et al.

(10) Patent No.: US 10,557,198 B2
(45) Date of Patent: Feb. 11, 2020

(54) GAS DISTRIBUTION APPARATUS AND SUBSTRATE PROCESSING APPARATUS INCLUDING THE SAME

(71) Applicant: Samsung Electronics Co., Ltd., Suwon-si, Gyeonggi-do (KR)

(72) Inventors: Heon Bok Lee, Suwon-si (KR); Dae Yong Kim, Yongin-si (KR); Dong Woo Kim, Hwaseong-si (KR); Jun Ki Park, Seoul (KR); Sang Yub Ie, Hwaseong-si (KR); Sang Jin Hyun, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/190,558

(22) Filed: Nov. 14, 2018

(65) Prior Publication Data
US 2019/0292664 A1 Sep. 26, 2019

(30) Foreign Application Priority Data
Mar. 23, 2018 (KR) .......... 10-2018-0033952

(51) Int. Cl.
*H01L 21/285* (2006.01)
*C23C 16/455* (2006.01)

(52) U.S. Cl.
CPC .. *C23C 16/45559* (2013.01); *C23C 16/45565* (2013.01); *H01L 21/28556* (2013.01)

(58) Field of Classification Search
CPC ........ C23C 16/45559; C23C 16/45565; H01L 21/28556
See application file for complete search history.

(56) References Cited

U.S. PATENT DOCUMENTS

| 9,502,237 B2 | 11/2016 | Yamaguchi et al. |
| 9,508,547 B1 | 11/2016 | Pasquale et al. |
| 2005/0155551 A1* | 7/2005 | Bae ............... C23C 16/4481 118/715 |
| 2007/0095286 A1 | 5/2007 | Baek et al. |
| 2011/0098841 A1 | 4/2011 | Tsuda |
| 2017/0008015 A1 | 1/2017 | La et al. |
| 2017/0236688 A1 | 8/2017 | Caron et al. |

FOREIGN PATENT DOCUMENTS

| KR | 10-0436047 | 6/2004 |
| KR | 10-1240110 | 3/2013 |
| KR | 10-1698376 | 1/2017 |
| KR | 1020170006178 | 1/2017 |
| KR | 1020170021210 | 2/2017 |
| KR | 1020170095151 | 8/2017 |

* cited by examiner

*Primary Examiner* — Kyoung Lee
(74) *Attorney, Agent, or Firm* — Myers Bigel, P.A.

(57) ABSTRACT

A substrate processing apparatus is provided. The substrate processing apparatus includes a substrate chuck, a shower head structure over the substrate chuck, and a gas distribution apparatus connected to the shower head structure. The gas distribution apparatus includes a dispersion container including a first dispersion space and a gas inlet section on the dispersion container. The gas inlet section includes a first inlet pipe including a first inlet path fluidly connected to the first dispersion space and a second inlet pipe including a second inlet path fluidly connected to the first dispersion space. The second inlet pipe surrounds at least a portion of a sidewall of the first inlet pipe.

20 Claims, 23 Drawing Sheets

I – I'

US 10,557,198 B2

GAS DISTRIBUTION APPARATUS AND SUBSTRATE PROCESSING APPARATUS INCLUDING THE SAME

CROSS-REFERENCE TO RELATED APPLICATION

This application claims priority under 35 U.S.C. § 119 to Korean Patent Application No. 10-2018-0033952, filed on Mar. 23, 2018 in the Korean Intellectual Property Office, the disclosure of which is hereby incorporated by reference in its entirety.

BACKGROUND

Example embodiments of the present disclosure relate to a gas distribution apparatus for uniformly spraying a gas and a substrate processing apparatus including the same.

An integrated circuit device is formed on a semiconductor substrate. The integrated circuit device is formed by repeatedly performing semiconductor fabrication processes, e.g., deposition processes and etching processes, on the semiconductor substrate. As the semiconductor substrate has a large diameter, a thickness distribution characteristic of a film deposited on the semiconductor substrate may be degraded, or an etch distribution characteristic in an etch process may be degraded.

SUMMARY

According to example embodiments of the inventive concepts, a substrate processing apparatus may include a substrate chuck, a shower head structure over the substrate chuck, and a gas distribution apparatus connected to the shower head structure. The gas distribution apparatus may include a dispersion container including a first dispersion space and a gas inlet section on the dispersion container. The gas inlet section may include a first inlet pipe including a first inlet path fluidly connected to the first dispersion space and a second inlet pipe including a second inlet path fluidly connected to the first dispersion space. The second inlet pipe may surround at least a portion of a sidewall of the first inlet pipe.

According to example embodiments of the inventive concepts, a substrate processing apparatus may include a substrate chuck configured to support a substrate, a shower head above the substrate chuck, a processing space between the shower head and the substrate chuck, and a gas distribution apparatus connected to the shower head and including a first dispersion space. The shower head may include a second dispersion space in communication with the first dispersion space and having a volume greater than the first dispersion space, a plate under the second dispersion space, and a plurality of through holes penetrating the plate and fluidly connecting the second dispersion space and the processing space. The gas distribution apparatus may include a dispersion container including the first dispersion space therein, a gas inlet section above the dispersion container, and a dispersion block connected to the dispersion container. The gas inlet section may include a first inlet pipe including a first inlet path therein and a second inlet pipe including a second inlet path therein. At least a portion of a sidewall of the dispersion block may be sloped with respect to a bottom wall of the dispersion container.

According to example embodiments of the inventive concepts, a semiconductor fabrication process may include mounting a semiconductor substrate on a substrate chuck, and providing a process gas to the semiconductor substrate through a gas distribution apparatus above the substrate chuck. The gas distribution apparatus may include a dispersion container, a gas inlet section above the dispersion container, and a dispersion block connected to a bottom wall of the dispersion container and having a sidewall sloped with respect to the bottom wall of the dispersion container. The gas inlet section may include a first inlet pipe including a first inlet path through which a first inlet gas passes and a second inlet pipe including a second inlet path through which a second inlet gas passes.

DETAILED DESCRIPTION

Various example embodiments will now be described more fully with reference to the accompanying drawings in which some example embodiments are shown. However, the inventive concepts may be embodied in many alternate forms and should not be construed as limited to only example embodiments set forth herein. As used herein the expression "and/or" includes any and all combinations of one or more of the associated listed items.

Figure 1:
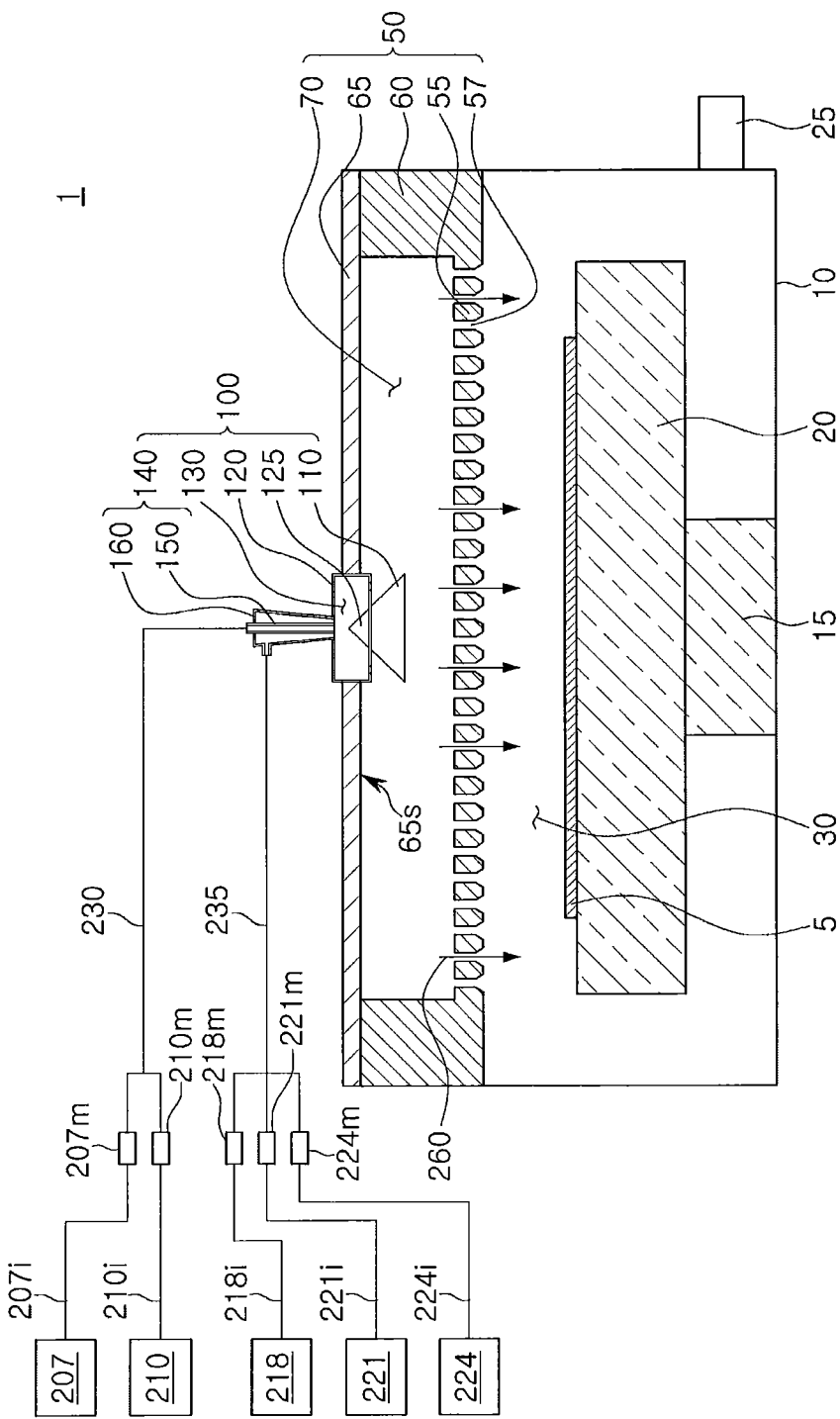
FIG. 1 is a schematic view of a substrate processing apparatus according to example embodiments.
Figure 2A:
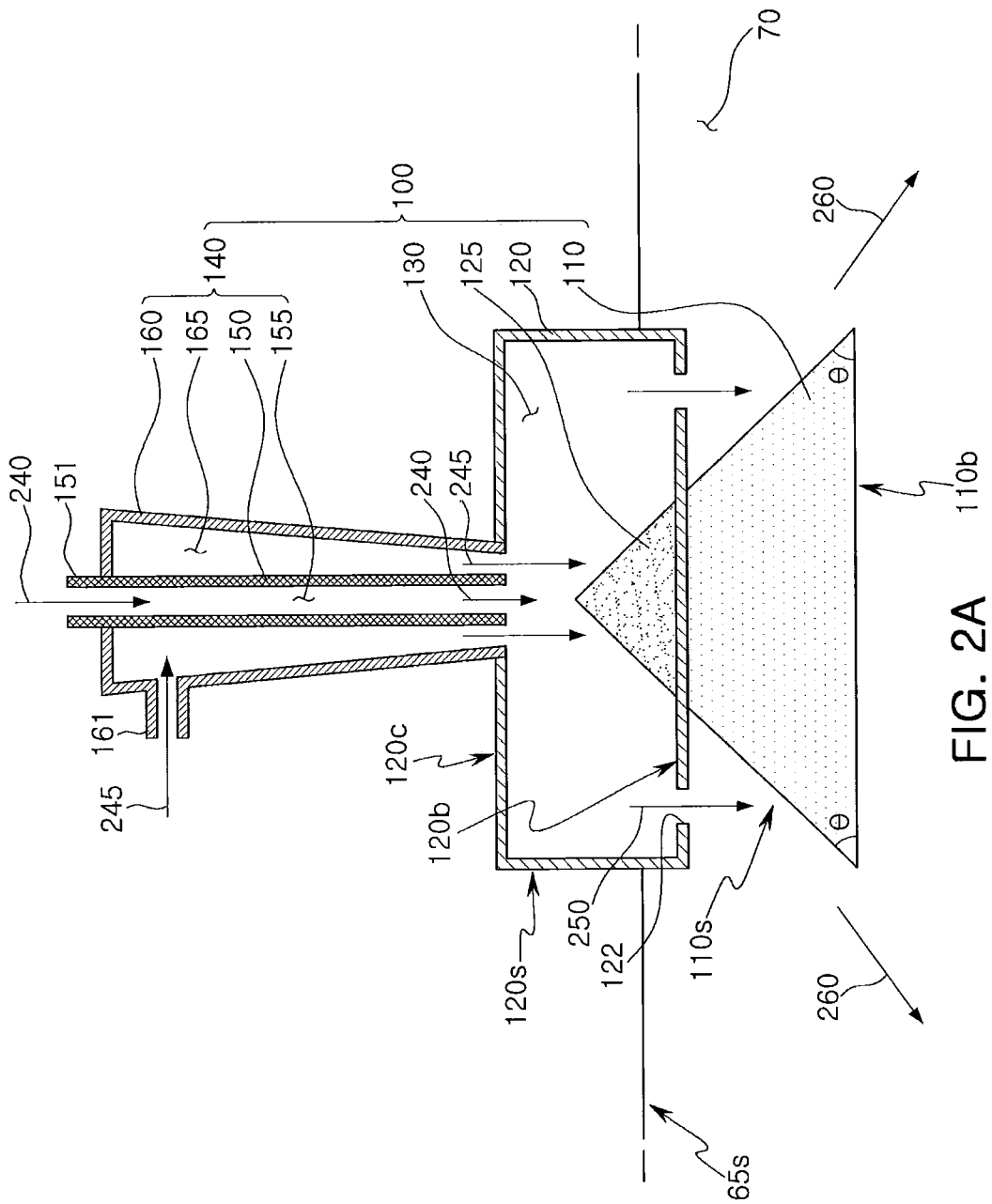
FIG. 2A is a cross-sectional view of a part of a substrate processing apparatus according to example embodiments.
Figure 2B:
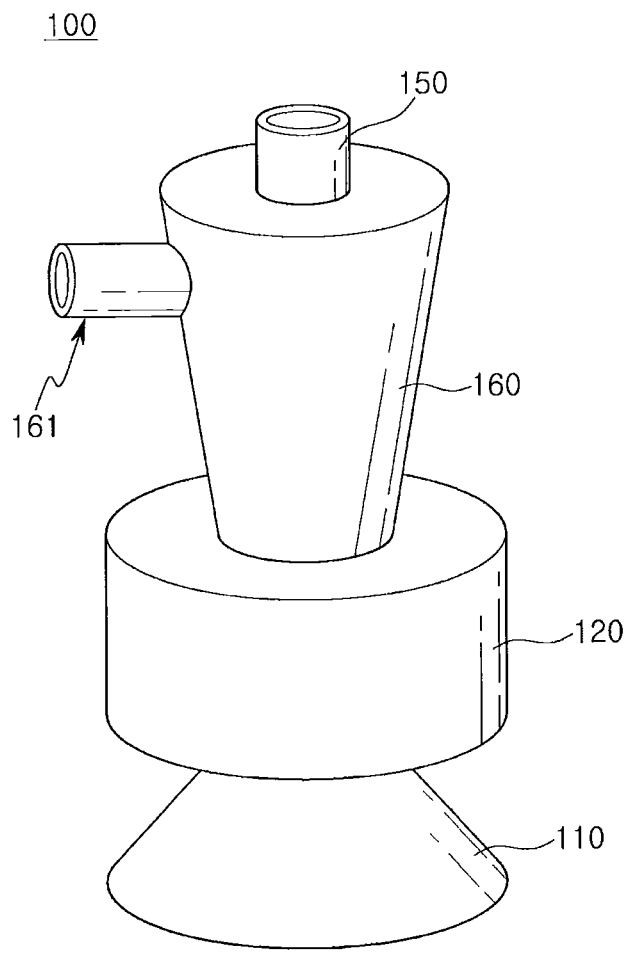
FIG. 2B is a perspective view conceptually illustrating a gas distribution apparatus of a substrate processing apparatus according to example embodiments.
Figure 3:
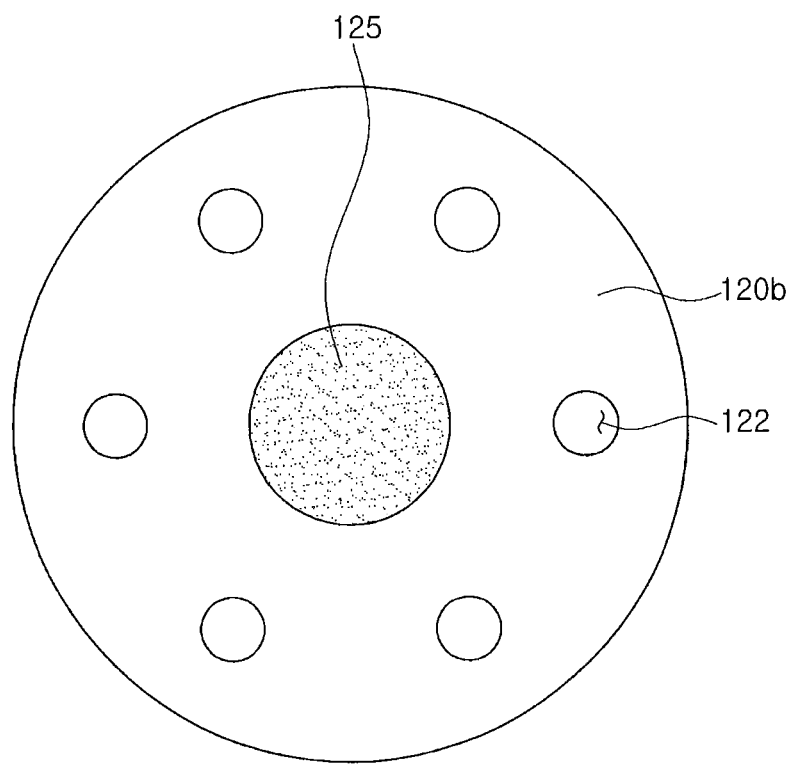
FIG. 3 is a top view of a part of a dispersion container of a gas distribution apparatus of a substrate processing apparatus according to example embodiments.

FIG. 1 is a schematic view of a substrate processing apparatus according to example embodiments. FIG. 2A is a cross-sectional view conceptually illustrating a part of a substrate processing apparatus according to example embodiments. FIG. 2B is a perspective view conceptually illustrating a gas distribution apparatus of a substrate processing apparatus according to example embodiments. FIG. 3 is a top view of a part of a dispersion container of a gas distribution apparatus of a substrate processing apparatus according to example embodiments.

Referring to FIGS. 1, 2A, 2B, and 3, a substrate processing apparatus 1 may include a processing chamber 10, a substrate chuck 20 in the processing chamber 10, a supporting shaft 15 for moving the substrate chuck 20 up and down, a shower head structure or shower head 50 over the substrate chuck 20, a processing space 30 between the substrate chuck 20 and the shower head structure 50, and a gas distribution apparatus 100 connected to the shower head structure 50. An exhaust section 25 may be disposed at a part of the processing chamber 10 such as at a bottom portion of the processing chamber 10. The exhaust section 25 may include a vacuum pump for adjusting an inside pressure of the processing chamber 10. A semiconductor substrate 5 may be mounted on and supported by the substrate chuck 20 to perform a substrate processing method, e.g., a semiconductor fabrication process. The processing space 30 may be a space in which the semiconductor fabrication process is performed on the semiconductor substrate 5.

The gas distribution apparatus 100 may include a first dispersion space 130.

As an example, the gas distribution apparatus 100 may include a dispersion container 120 in which the first dispersion space 130 is defined or formed and a gas inlet section 140 on the dispersion container 120.

As an example, the dispersion container 120 may have a cylinder or cylindrical shape. For example, the dispersion container 120 may a bottom part, portion, or wall 120b, a ceiling part or portion or top part, portion, or wall 120c opposite to the bottom part 120b, and a side part, portion, or wall 120s connecting the bottom part 120b and an edge of the ceiling part 120c. The bottom part 120b, the ceiling part 120c, and the side part 120s may define the first dispersion space 130.

As an example, the gas inlet section 140 may be connected to the ceiling part 120c of the dispersion container 120.

The gas inlet section 140 may include a first inlet pipe 150 and a second inlet pipe 160. The second inlet pipe 160 may surround at least a portion of a sidewall of the first inlet pipe 150. As an example, the first inlet pipe 150 may pass through the second inlet pipe 160 and extend above or over an upper portion of the second inlet pipe 160.

A first inlet path 155 may be defined or formed in the first inlet pipe 150, and a second inlet path 165 may be defined or formed in the second inlet pipe 160. The first inlet pipe 150 may pass through a center portion of the second inlet path 165 in an extension direction of the second inlet path 165. Thus, the second inlet path 165 may surround an outer sidewall of the first inlet pipe 150.

As an example, the first inlet pipe 150 may have a hollow pipe shape with a constant or predetermined width or diameter. The first inlet pipe 150 may include a first connection part 151 at an upper part or portion thereof. The upper part of the first inlet pipe 150 at which the first connection part 151 is disposed may be relatively remote from the dispersion container 120.

As an example, the second inlet pipe 160 may have a width or diameter of a part or portion remote from the dispersion container 120 greater than that of a part or portion close to the dispersion container 120. The second inlet pipe 160 may include a lower part or portion adjacent to the first dispersion space 130 and an upper part or portion remote from the first dispersion space 130 compared to the lower part thereof. The upper part of the second inlet pipe 160 may have a greater width or diameter than that of the lower part thereof. For example, the second inlet pipe 160 may have a width or diameter gradually increasing in a direction extending away from the dispersion container 120. The second inlet path 165 in the second inlet pipe 160 may have a width or diameter gradually increasing in a direction extending away from the first dispersion space 130.

The second inlet pipe 160 may include a second connection part 161 at an upper portion thereof. The upper part or portion of the second inlet pipe 160 at which the second connection part 161 is disposed may be relatively remote from the dispersion container 120.

The first and second inlet paths 155 and 165 may communicate with the first dispersion space 130 of the dispersion container 120.

As an example, the gas distribution apparatus 100 may include at least one dispersion block. For example, the gas distribution apparatus 100 may include an inside dispersion block 125 inside the dispersion container 120 and/or an outside dispersion block 110 outside the dispersion container 120.

The inside dispersion block 125 may be disposed above the bottom part 120b of the dispersion container 120, and the outside dispersion block 110 may be disposed below bottom part 120b of the dispersion container 120.

At least a portion of a sidewall of the dispersion block may be inclined with respect to the bottom part 120b of the dispersion container 120. For example, the inside dispersion block 125 may be formed in a conic or conical shape, of which a width or diameter decreases in an upward direction from the bottom part 120b of the dispersion container 120 toward the ceiling part 120c of the dispersion container 120. Thus, the inside dispersion block 125 may have a sidewall inclined with respect to the bottom part 120b of the dispersion container 120 (or the inside dispersion block 125 may have a sloped sidewall).

The outside dispersion block 110 may have a shape of which a width or diameter increases in a downward direction extending away from the bottom part 120b of the dispersion container 120. For example, the outside dispersion block 110 may be formed in a shape of which a width or diameter decreases in a direction from its lower part or portion to its upper part or portion. The upper part of the outside dispersion block 110 may be coupled with the bottom part 120b of the dispersion container 120. The outside dispersion block 110 may have a sidewall 110s angled or sloped with respect to the bottom part 120b of the dispersion container (e.g., the outside dispersion block 110 may have a sloped sidewall 110s)

The dispersion container 120 may include dispersion holes 122 penetrating the bottom part 120b of the dispersion container 120. The dispersion holes 122 may be arranged to surround a perimeter of the inside dispersion block 125, as shown in the top view of FIG. 3. At least a portion of the sidewall 110s of the outside dispersion block 110 may be disposed below the dispersion holes 122.

The shower head structure 50 may include a second dispersion space 70. The second dispersion space 70 may have a volume greater than that of the first dispersion space 130. The shower head structure 50 may include a plate or plate section 55 below the second dispersion space 70, through holes 57 penetrating the plate section 55, a side section 60 defining a side of the second dispersion space 70, and a cover or cover section 65 on an upper portion of the second dispersion space 70. The through holes 57 may communicate with the second dispersion space 70 and the processing space 30. Accordingly, the second dispersion space 70 and the processing space 30 may be connected (e.g., fluidly connected) by the through holes 57.

At least a part of the gas distribution apparatus 100 may extend into the second dispersion space 70 beyond or below a lower surface 65s of the cover section 65. The dispersion holes 122 of the dispersion container 120 of the gas distribution apparatus 100 may be in communication with the second dispersion space 70. Thus, the first dispersion space 130 of the dispersion container 120 may be connected (e.g., fluidly connected) to the second dispersion space 70 of the shower head structure 50 through the dispersion holes 122. The cover section 65 may have various shapes, such as a flat plate shape, an upward convex hemispherical shape, or an upward convex box shape.

As used herein, the "dispersion space" may be replaced by a substitute term "mixture space" in which a plurality of gases are mixed. For example, the "first dispersion space 130" may be referred to as a "first mixture space 130", and "the second dispersion space 70" may be referred to as a "second mixture space 70".

As used herein, in the "inside dispersion block" and the "outside dispersion block", the term "inside" and "outside" are used to distinguish the dispersion blocks and may be replaced by other terms. For example, the "inside dispersion block 125" may be replaced by a "first dispersion block 125", and the "outside dispersion block 110" may be replaced by a "second dispersion block 110".

As an example, the gas distribution apparatus 100 may be connected to a plurality of gas storage containers for supplying a plurality of gases and a plurality of lines through which a plurality of gases may pass. For example, the plurality of gas storage containers may include a first gas storage container 207 for storing a first gas, a second gas storage container 210 for storing a second gas, a third gas storage container 218 for storing a third gas, a fourth gas storage container 221 for storing a fourth gas, and a fifth gas storage container 224 for storing a fifth gas.

The first gas storage container 207 may be connected to a first gas supply line 207i. The second gas storage container 210 may be connected to a second gas supply line 210i. The third gas storage container 218 may be connected to a third gas supply line 218i. The fourth gas storage container 221 may be connected to a fourth gas supply line 221i. The fifth gas storage container 224 may be connected to a fifth gas supply line 224i.

A first flow controller 207m for controlling a flow rate of the first gas supplied from the first gas storage container 207 may be disposed in the first gas supply line 207i. A second flow controller 210m for controlling a flow rate of the second gas supplied from the second gas storage container 210 may be disposed in the second gas supply line 210i. A third flow controller 218m for controlling a flow rate of the third gas supplied from the third gas storage container 218 may be disposed in the third gas supply line 218i. A fourth flow controller 221m for controlling a flow rate of the fourth gas supplied from the fourth gas storage container 221 may be disposed in the fourth gas supply line 221i. A fifth flow controller 224m for controlling a flow rate of the fifth gas supplied from the fifth gas storage container 224 may be disposed in the fifth gas supply line 224i. Each of the first to fifth flow controllers 207m, 210m, 218m, 221m, and 224m may be or include a mass flow controller (MFC) for controlling the flow rate of the gas.

The first connection part 151 of the first inlet pipe 150 may be connected to a first inlet line 230. The second connection part 161 of the second inlet pipe 160 may be connected to a second inlet line 235.

As an example, the first inlet line 230 may be connected to the first and second gas supply lines 207i and 210i. The second inlet line 235 may be connected to the third to fifth gas supply lines 218i, 221i, and 224i. The first gas supplied from the first gas storage container 207 and the second gas supplied from the second gas storage container 210 may be introduced into the first inlet path 155 of the first inlet pipe 150 of the gas distribution apparatus 100 through the first inlet line 230.

The third gas supplied from the third gas storage container 218, the fourth gas supplied from the fourth gas storage container 221, and the fifth gas supplied from the fifth gas storage container 224 may be introduced into the second inlet path 165 of the second inlet pipe 160 of the gas distribution apparatus 100 through the second inlet line 235.

As used herein, the gas introduced into the first inlet path 155 of the first inlet pipe 150 is referred to as a "first inlet gas 240", and the gas introduced into the second inlet path 165 of the second inlet pipe 160 is referred to as a "second inlet gas 245". Accordingly, the first inlet gas 240 may be at least one of the first gas and the second gas, and the second inlet gas 245 may be at least one of the third to fifth gases. Kinds of the first and second inlet gases 240 and 245 may be varied depending on the semiconductor fabrication process, e.g., the deposition process or the etch process, performed on the semiconductor substrate 5. For example, when metal nitride, e.g., TiN, is deposited on the semiconductor substrate 5, the first gas in the first gas storage container 207 may be $TiCl_4$, the second gas in the second gas storage container 210 may be Ar, the third gas in the third gas storage container 218 may be $NH_3$, the fourth gas in the fourth gas storage container 221 may be Ar, and the fifth gas in the fifth gas storage container 224 may be $H_2$. Thus, the first inlet gas 240 may include $TiCl_4$ and/or Ar, and the second inlet gas 245 may include $NH_3$, Ar, and/or $H_2$.

The first inlet gas 240 may pass through the first inlet path 155 of the first inlet pipe 150 and may be introduced into the first dispersion space 130. The second inlet gas 245 may pass through the second inlet path 165 of the second inlet pipe 160 and may be introduced into the first dispersion space 130.

The first and second inlet gases 240 and 245 may be uniformly mixed in the first dispersion space 130 due to the inside dispersion block 125. The first and second inlet gases 240 and 245 introduced into the first dispersion space 130 through the first and second inlet paths 155 and 165 may be uniformly dispersed in the first dispersion space 130 due to the inside dispersion block 125. For example, since the uppermost portion of the inside dispersion block 125 is disposed below the first inlet path 155, the first inlet gas 240 introduced into the first dispersion space 130 through the first inlet path 155 may move along the sloped sidewall of the inside dispersion block 125 and may spread into the first dispersion space 130. Additionally, the second inlet gas 245 introduced into the first dispersion space 130 through the second inlet path 165 may collide with the sloped sidewall of the inside dispersion block 125 and may spread into the first dispersion space 130. The second inlet gas 245 introduced into the first dispersion space 130 through the second inlet path 165 may be mixed in the first dispersion space 130 with the first inlet gas 240 moving along the sloped sidewall of the inside dispersion block 125 and spreading into the first dispersion space 130.

A first dispersion gas 250 formed by the mixture and dispersion of the first and second inlet gases 240 and 245 in the first dispersion space 130 may be introduced into the second dispersion space 70 through the dispersion holes 122 of the dispersion container 120.

The first dispersion gas 250 sprayed through the dispersion holes 122 from the first dispersion space 130 may collide with the sidewall 110s of the outside dispersion block 110 and may spread into the second dispersion space 70. The outside dispersion block 110 may function so that the first and second inlet gases 240 and 245 constituting the first dispersion gas 250 may be uniformly mixed with each other and may be uniformly dispersed into the second dispersion space 70.

As used herein, the first dispersion gas 250 dispersed in the second dispersion space 70 is referred to as a second dispersion gas 260. Accordingly, the second dispersion gas 260 may be uniformly dispersed in the second dispersion space 70 due to the outside dispersion block 110.

The second dispersion gas 260 uniformly dispersed in the second dispersion space 70 may be uniformly sprayed in the processing space 30 through the through holes 57 of the plate section 55. The second dispersion gas 260 sprayed in the processing space 30 may be provided to the semiconductor substrate 5 and may be used to perform the semiconductor fabrication process on the semiconductor substrate 5. The semiconductor fabrication process may be uniformly performed across an entire upper surface of the semiconductor substrate 5.

As described above, the second dispersion gas 260 may include at least two gases, such as, $TiCl_4$ and $NH_3$. However, according to a stage of the semiconductor fabrication process or the kind of the semiconductor fabrication process, the second dispersion gas 260 may be composed of one kind of gas. For example, when a process stage using only Ar gas to generate plasma or purge is performed, the Ar gas discharged from any one of the second gas storage container 210 and the fourth gas storage container 221 may sequentially pass through the first dispersion space 130 and the second dispersion space 70 and may move into the processing space 30. In this case, the Ar gas may pass through the aforementioned gas distribution apparatus 100 and may be uniformly dispersed in the second dispersion space 70. The Ar gas may be uniformly sprayed into the processing space 30 through the through holes 57 of the plate section 55.

The outside dispersion block 110 may have a bottom or lower surface 110b and the sidewall 110s. The outside dispersion block 110 may be tapered in an upward direction from the bottom surface 110b thereof to the dispersion container 120. Thus, the sidewall 110s of the outside dispersion block 110 may be inclined or sloped. In the outside dispersion block 110, the bottom surface 110b may form an acute angle with the sidewall 110s. In the outside dispersion block 110, an angle θ between the bottom surface 110b and the sidewall 110s may be varied in a range of the acute angle. In other words, the slope of the sidewalls 110s of the outside dispersion block 110 may be varied depending on a process condition of the semiconductor fabrication process to perform using the substrate processing apparatus 1.

Figure 4:
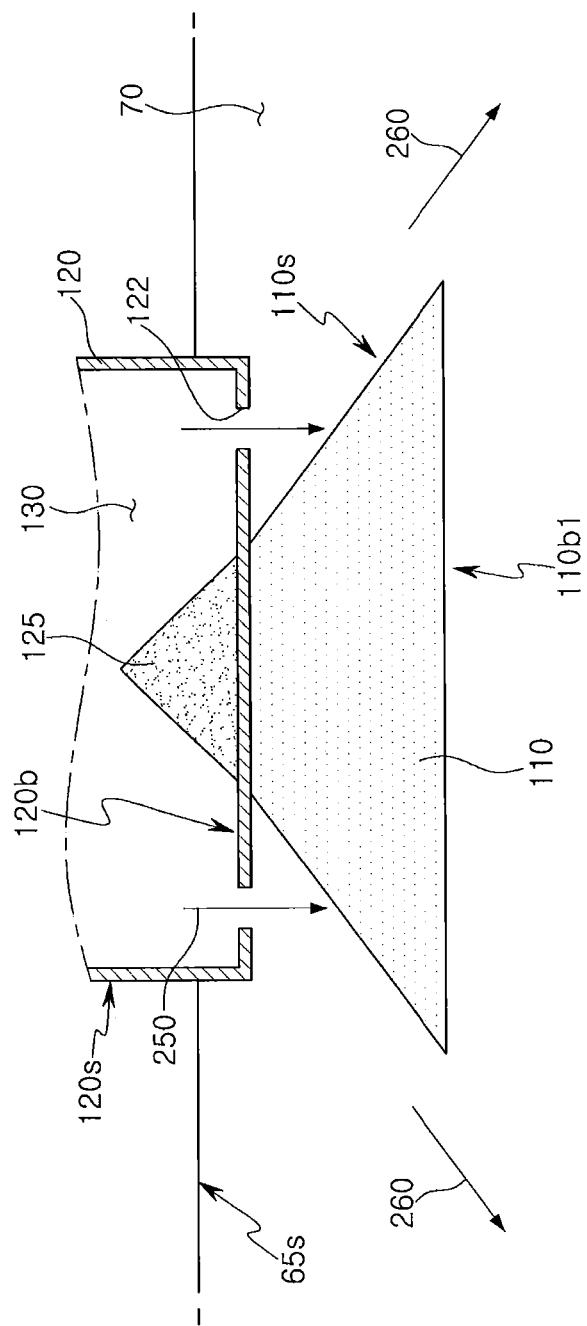
FIG. 4 is a cross-sectional view of a part of a substrate processing apparatus according to example embodiments.
Figure 5:
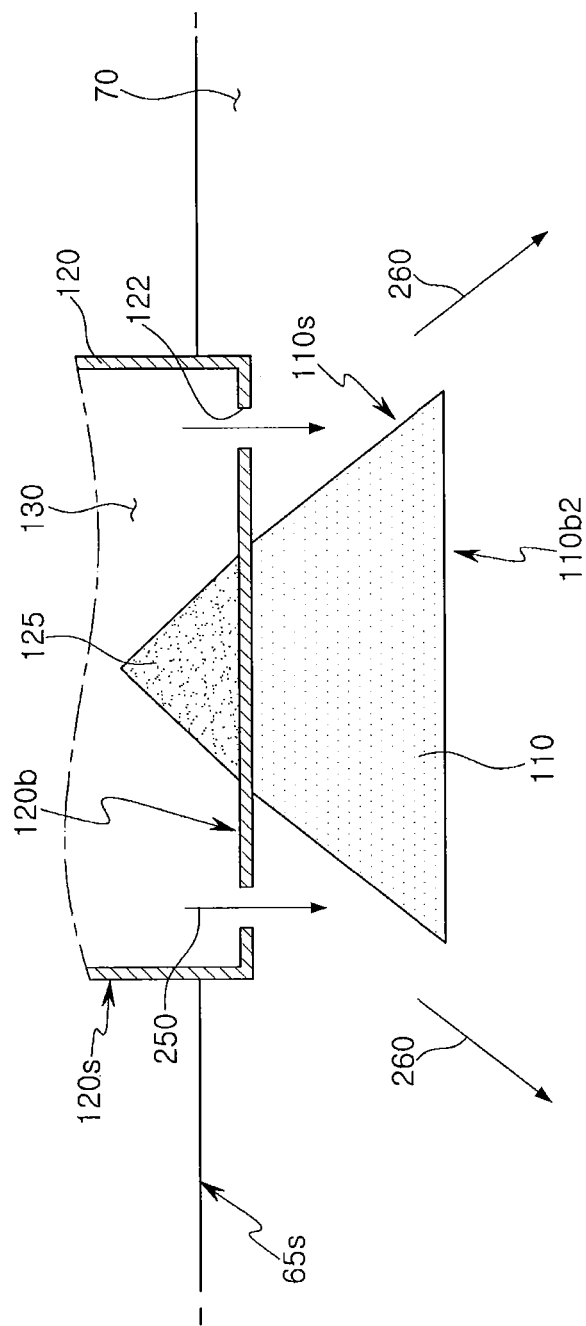
FIG. 5 is a cross-sectional view of a part of a substrate processing apparatus according to example embodiments.

As an example, a width or diameter of the bottom surface 110b of the outside dispersion block 110 may be substantially equal to a width or diameter of the dispersion container 120. However, the inventive concepts are not limited thereto. FIGS. 4 and 5 are cross-sectional views illustrating modified examples of the outside dispersion block 110 of the substrate processing apparatus 1 according to example embodiments.

Referring to FIG. 4, the outside dispersion block 110 may be modified to have a bottom surface 110b1 having a width or diameter greater than that of the dispersion container 120.

Referring to FIG. 5, the outside dispersion block 110 may be modified to have a bottom surface 110b2 having a width or diameter smaller than that of the dispersion container 120.

Referring again to FIGS. 1, 2A, 2B, and 3, the sidewall 110s of the outside dispersion block 110 may have a linear shape with a predetermined slope. However, the inventive concepts are not limited thereto. FIGS. 6A, 6B, 7A, 7B, 8, and 9 are cross-sectional views illustrating various modified examples of the outside dispersion block 110 of the substrate processing apparatus 1 according to example embodiments.

Figure 6A:
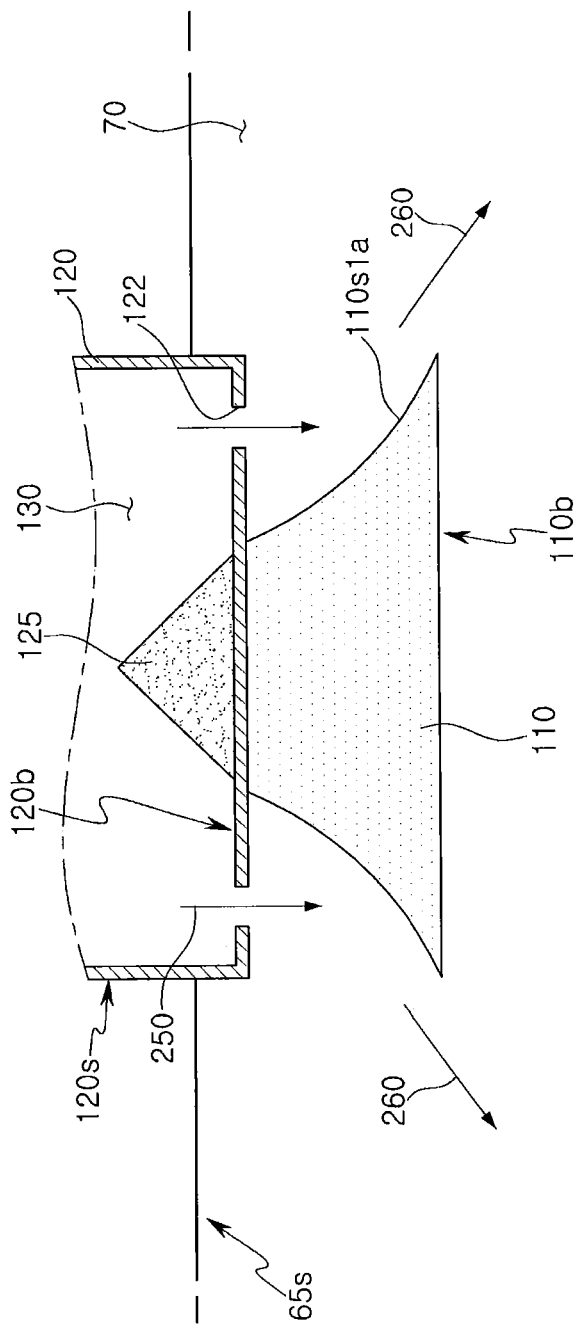
FIG. 6A is a cross-sectional view of a part of a substrate processing apparatus according to example embodiments.

Referring to FIG. 6A, the outside dispersion block 110 may be modified to have a sidewall 110s1a that is concave.

Figure 6B:
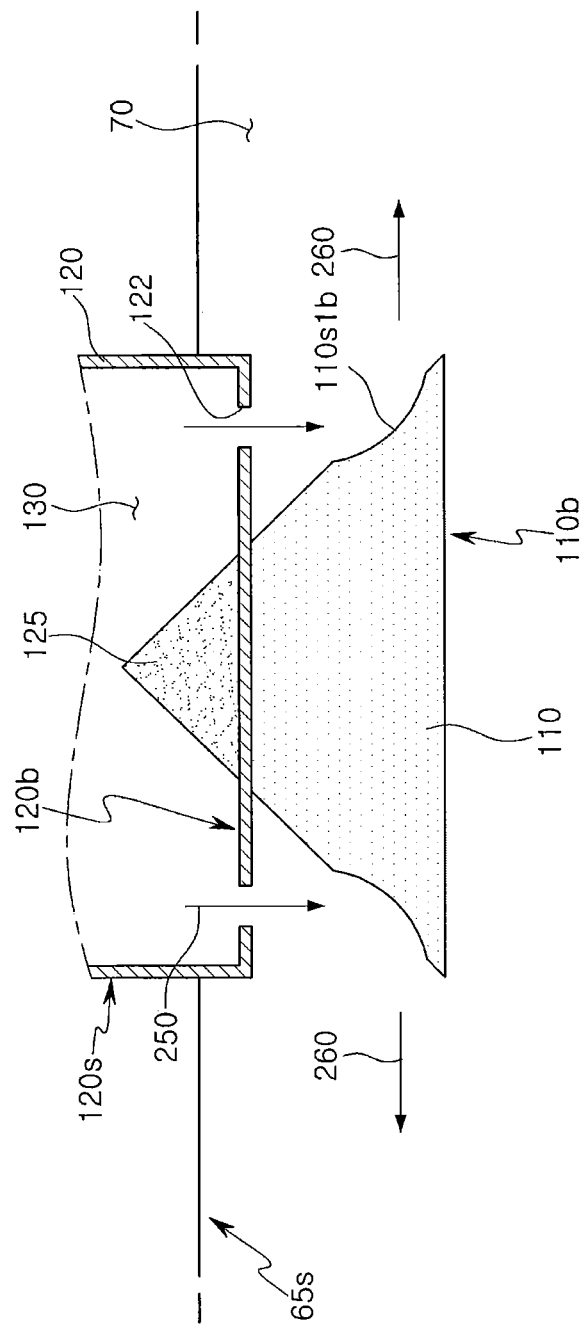
FIG. 6B is a cross-sectional view of a part of a substrate processing apparatus according to example embodiments.

Referring to FIG. 6B, the outside dispersion block 110 may be modified to have a sidewall 110s1b of which a portion is concave. The concave portion of the modified sidewall 110s1b of the outside dispersion block 110 may be formed at a position opposite to the dispersion holes 122 (e.g., at a lower portion of the outside dispersion block 110).

Figure 7A:
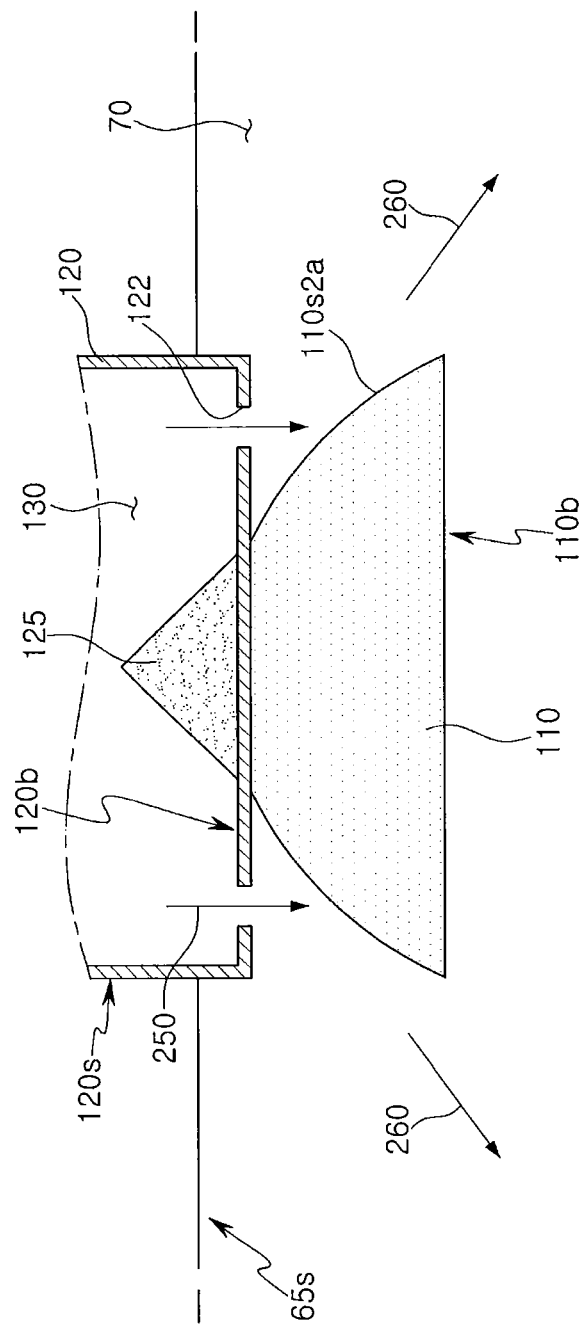
FIG. 7A is a cross-sectional view of a part of a substrate processing apparatus according to example embodiments.

Referring to FIG. 7A, the outside dispersion block 110 may be modified to have a sidewall 110s2a that is convex.

Figure 7B:
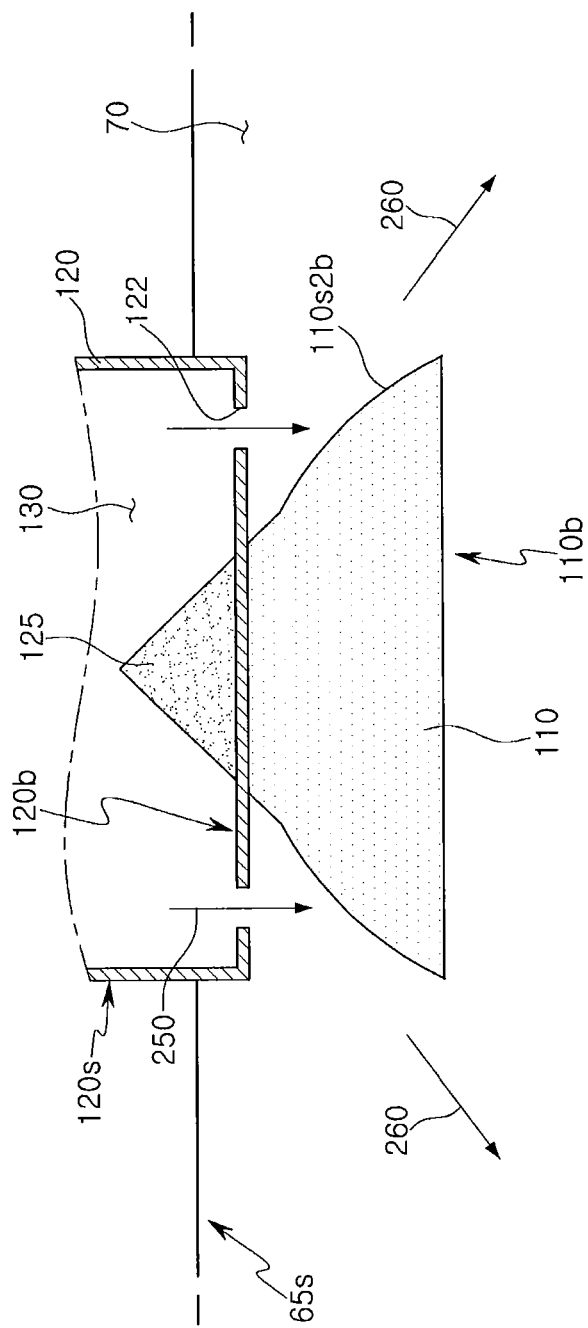
FIG. 7B is a cross-sectional view of a part of a substrate processing apparatus according to example embodiments.

Referring to FIG. 7B, the outside dispersion block 110 may be modified to have a sidewall 110s2b of which a portion is convex. The convex portion of the modified sidewall 110s2b of the outside dispersion block 110 may be formed at a position opposite to the dispersion holes 122 (e.g., at a lower portion of the outside dispersion block 110).

Figure 8:
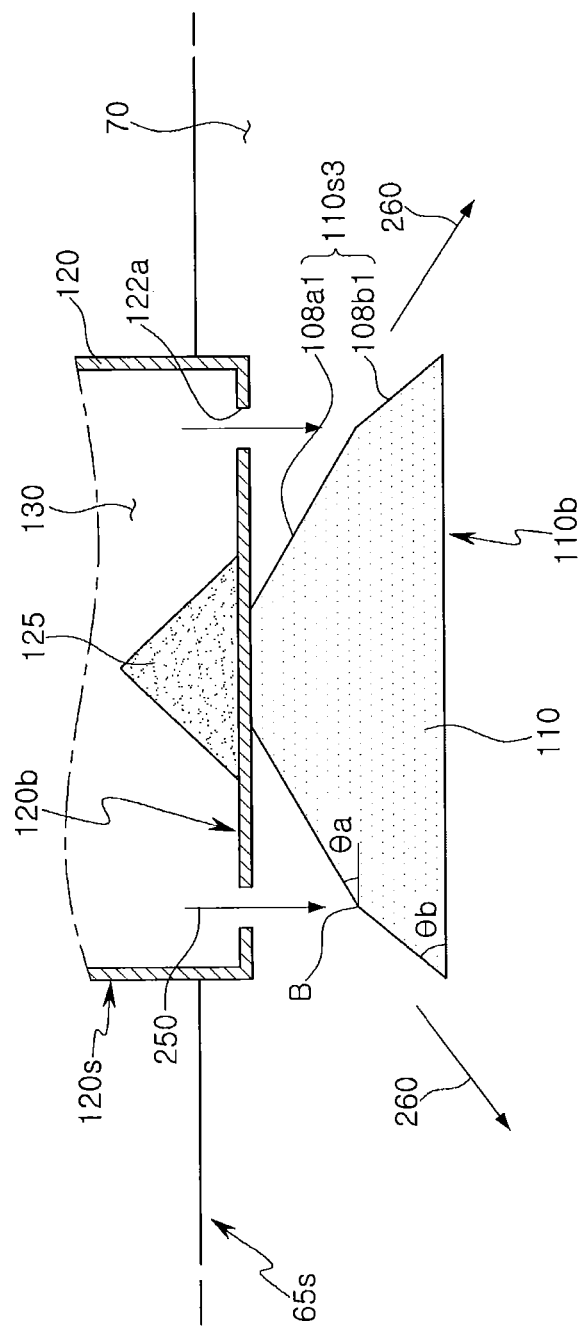
FIG. 8 is a cross-sectional view of a part a substrate processing apparatus according to example embodiments.

Referring to FIG. 8, the outside dispersion block 110 may be modified to have a sidewall 110s3 including a first sidewall portion 108a1 and a second sidewall portion 108b1 having a slope greater than the first sidewall portion 108a1. For example, in the sidewall 110s3 of the outside dispersion block 110, a sloped angle θa of the first sidewall portion 108a1 may be smaller than a sloped angle θb of the second sidewall portion 108b1. As used herein, the "sloped angle θa" of the first sidewall portion 108a1 may mean an angle between the first sidewall portion 108a1 and the bottom surface 110b, and the "sloped angle θb" of the second sidewall portion 108b1 may mean an angle between the second sidewall portion 108b1 and the bottom surface 110b. In the sidewall 110s3 of the outside dispersion block 110, the first sidewall portion 108a1 may be closer than the second sidewall portion 108b1 to the dispersion container 120. The first sidewall portion 108a1 may be at an upper portion of the outside dispersion block 110 and the second sidewall portion 108b1 may be at a lower portion of the outside dispersion block 110.

In the sidewall 110s3 of the outside dispersion block 110, a boundary B between the first sidewall portion 108a1 and the second sidewall portion 108b1 may be disposed below the dispersion holes 122. Thus, the first dispersion gas 250 sprayed through the dispersion holes 122 may collide with the boundary B and a portion of the sidewall 110s3 of the outside dispersion block 110 adjacent to the boundary B and may uniformly spread in the second dispersion space 70.

Figure 9:
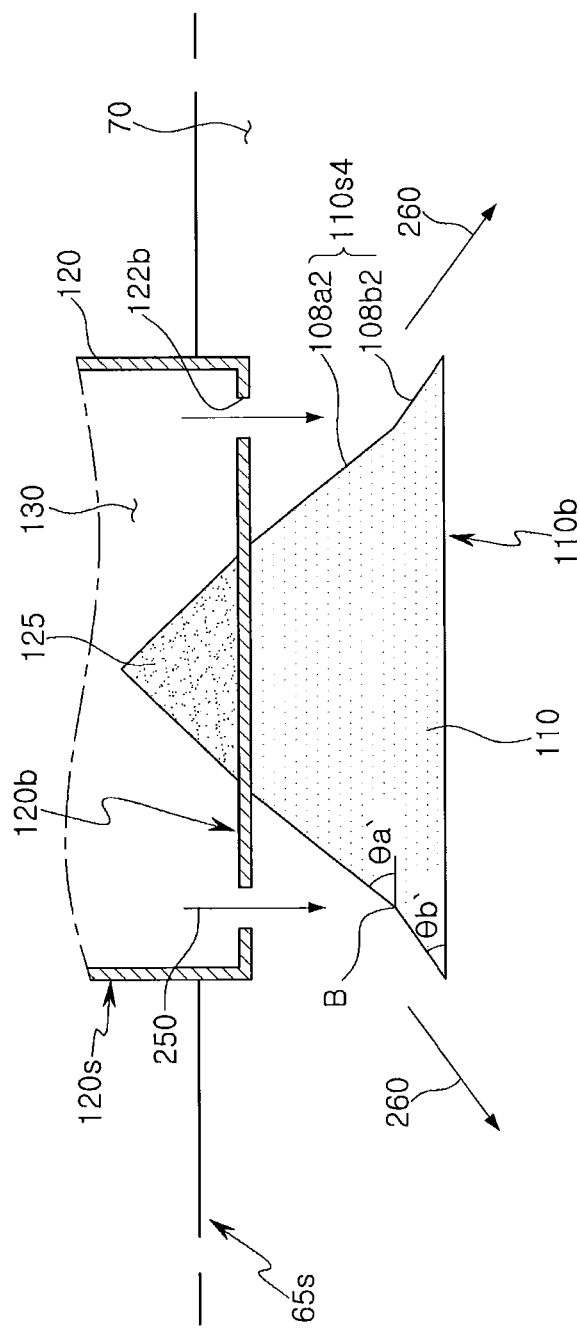
FIG. 9 is a cross-sectional view of a part of a substrate processing apparatus according to example embodiments.

Referring to FIG. 9, the outside dispersion block 110 may be modified to have a sidewall 110s4 including a first sidewall portion 108a2 and a second sidewall portion 108b2 having a slope less than the first sidewall portion 108a2. For example, in the sidewall 110s4 of the outside dispersion block 110, a sloped angle θa' of the first sidewall portion 108a2 may be greater than a sloped angle θb' of the second sidewall portion 108b2. In the sidewall 110s4 of the outside dispersion block 110, the first sidewall portion 108a2 may be closer than the second sidewall portion 108b2 to the dispersion container 120. The first sidewall portion 108a2 may be at or extend from an upper portion of the outside dispersion block 110 and the second sidewall portion 108b2 may be at a lower portion of the outside dispersion block 110.

In the sidewall 110s4 of the outside dispersion block 110, the boundary B between the first sidewall portion 108a2 and the second sidewall portion 108b2 may be disposed below the dispersion holes 122 to have a similar effect as described above with regard to FIG. 8.

Figure 10:
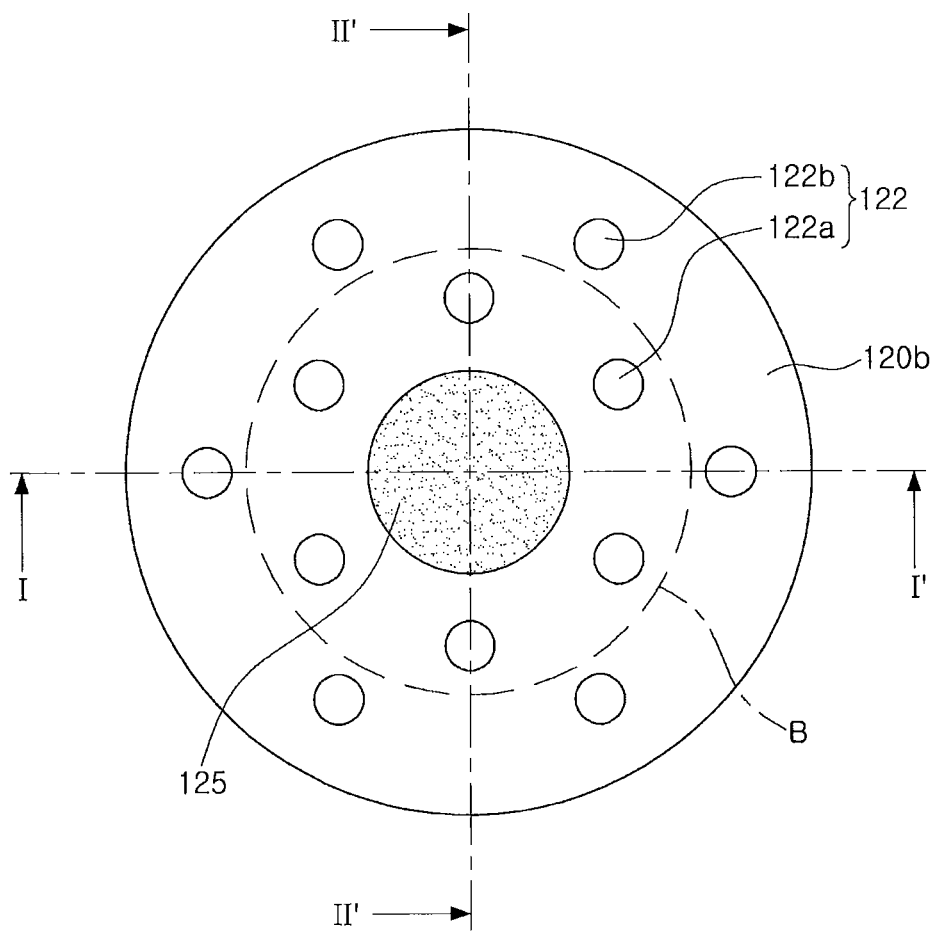
FIG. 10 is top view of a part of a dispersion container of a gas distribution apparatus of a substrate processing apparatus according to example embodiments.
Figure 11A:
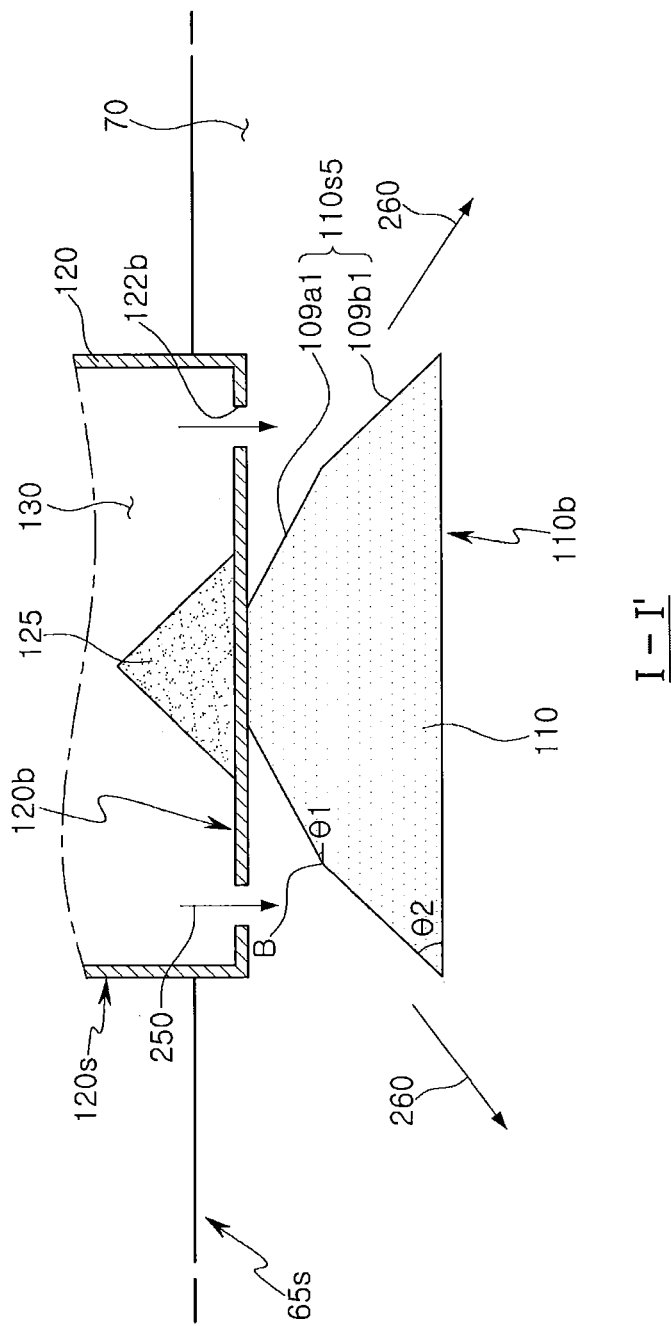
FIGS. 11A and 11B are cross-sectional views of a part of a substrate processing apparatus according to example embodiments.
Figure 11B:
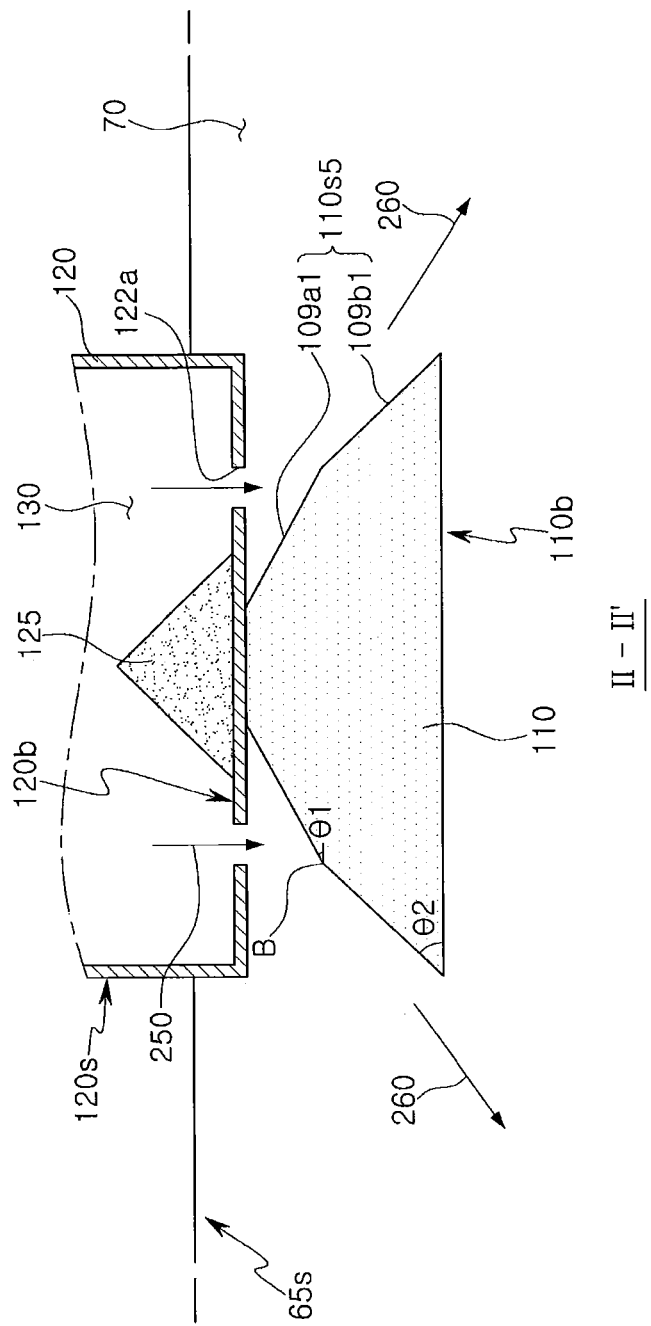
Figure 12A:
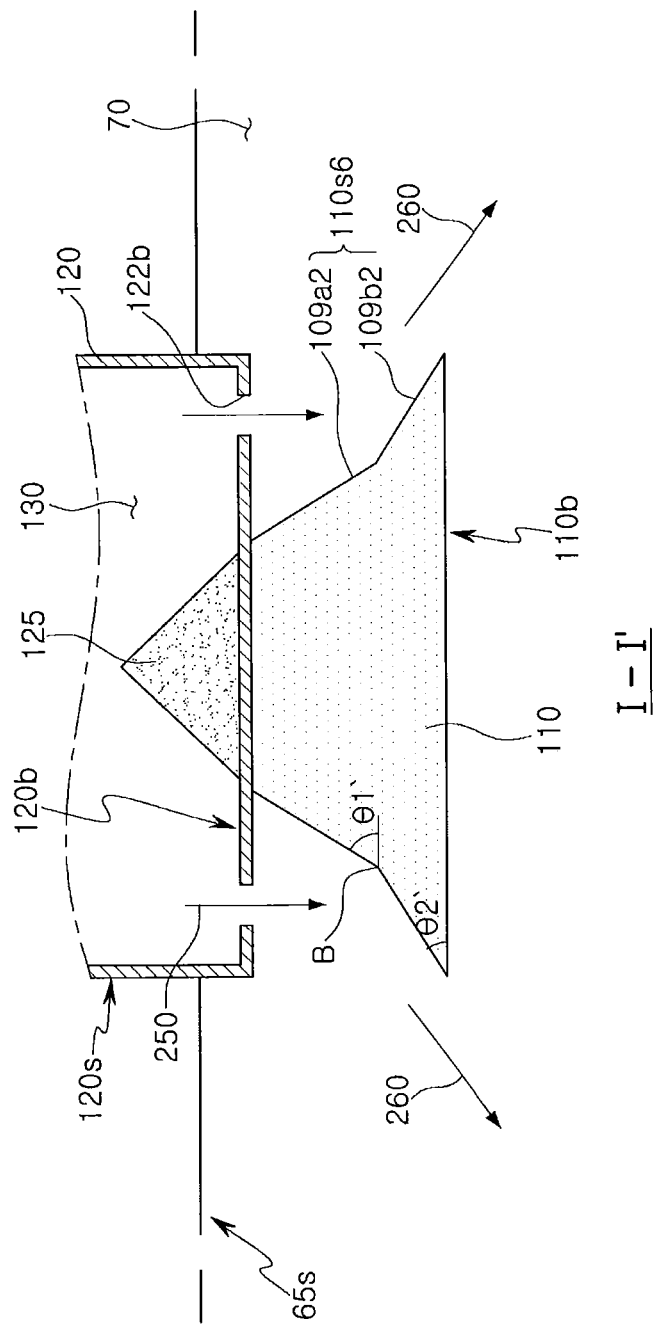
FIGS. 12A and 12B are cross-sectional views of a part of a substrate processing apparatus according to example embodiments.
Figure 12B:
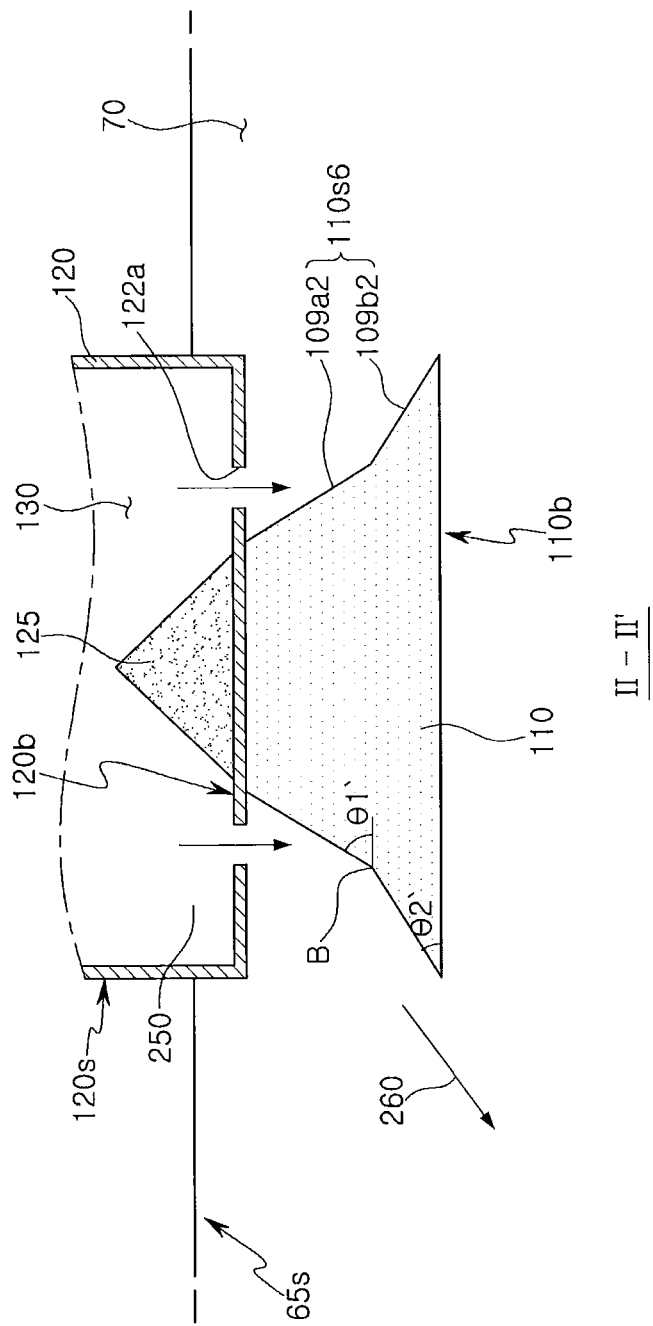

Referring again to FIGS. 1, 2A, 2B, and 3, the dispersion holes 122 may be spaced a predetermined distance apart from the inside dispersion block 125. However, the inventive concepts are not limited thereto. FIG. 10 is a top view of a part of a dispersion container of a substrate processing apparatus according to example embodiments. FIG. 11A is a cross-sectional view taken along line I-I' of FIG. 10. FIG. 11B is a cross-sectional view taken along line II-IF of FIG. 10. FIG. 12A is a cross-sectional view taken along line I-I' of FIG. 10. FIG. 12B is a cross-sectional view taken along line II-IP of FIG. 10.

Referring to FIGS. 10, 11A, and 11B, the dispersion holes 122 may include first dispersion holes 122a and second dispersion holes 122b. The second dispersion holes 122b may be more remote than the first dispersion holes 122a from the inside dispersion block 125. That is, the second dispersion holes 122b may be spaced apart radially a greater distance from the inside dispersion block 125 than are the first dispersion holes 122a.

The outside dispersion block 110 may be modified to have a sidewall 110s5 including a first sidewall portion 109a1 opposite to and below the first dispersion holes 122a and a second sidewall portion 109b1 opposite to and below the second dispersion holes 122b and having a slope greater than the first sidewall portion 109a1. For example, in the sidewall 110s5 of the outside dispersion block 110, a sloped angle θ1 of the first sidewall portion 109a1 may be smaller than a sloped angle θ2 of the second sidewall portion 109b1. As used herein, the "sloped angle θ1" of the first sidewall portion 109a1 may mean an angle between the first sidewall portion 109a1 and the bottom surface 110b, and the "sloped angle θ2" of the second sidewall portion 109b1 may mean an angle between the second sidewall portion 109b1 and the bottom surface 110b. Thus, in the sidewall 110s5 of the outside dispersion block 110, the first sidewall portion 109a1 opposite to and below the first dispersion holes 122a may have a slope less than the second sidewall portion 109b1 opposite to and below the second dispersion holes 122b. As an example, a boundary B between the first sidewall portion 109a1 and the second sidewall portion 109b1 may not be overlapped with or align with first and second dispersion holes 122a and 122b.

Referring to FIGS. 10, 12A, and 12B, as described above, the dispersion holes 122 may include the first dispersion holes 122a and the second dispersion holes 122b more remote than the first dispersion holes 122a from the inside dispersion block 125.

The outside dispersion block 110 may be modified to have a sidewall 110s6 including a first sidewall portion 109a2 opposite to and below the first dispersion holes 122a and a second sidewall portion 109b2 opposite to and below the second dispersion holes 122b and having a slope less than the first sidewall portion 109a2. In the sidewall 110s6 of the outside dispersion block 110, a sloped angle θ1' of the first sidewall portion 109a2 may be greater than a sloped angle θ2' of the second sidewall portion 109b2. As an example, a boundary B between the first sidewall portion 109a2 and the second sidewall portion 109b2 may not be overlapped with or aligned with first and second dispersion holes 122a and 122b.

Figure 13:
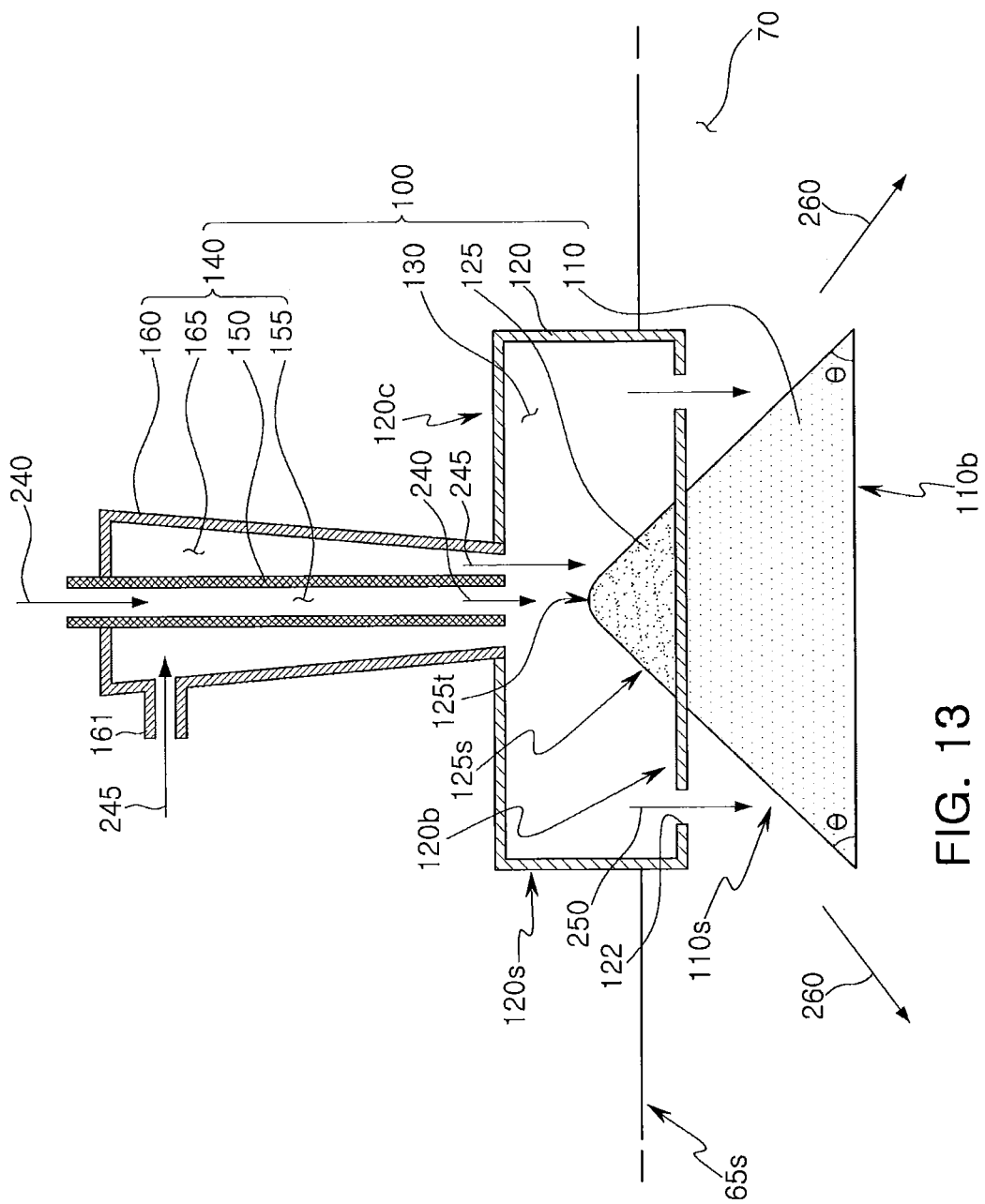
FIG. 13 is a cross-sectional view of a part of a substrate processing apparatus according to example embodiments.
Figure 14:
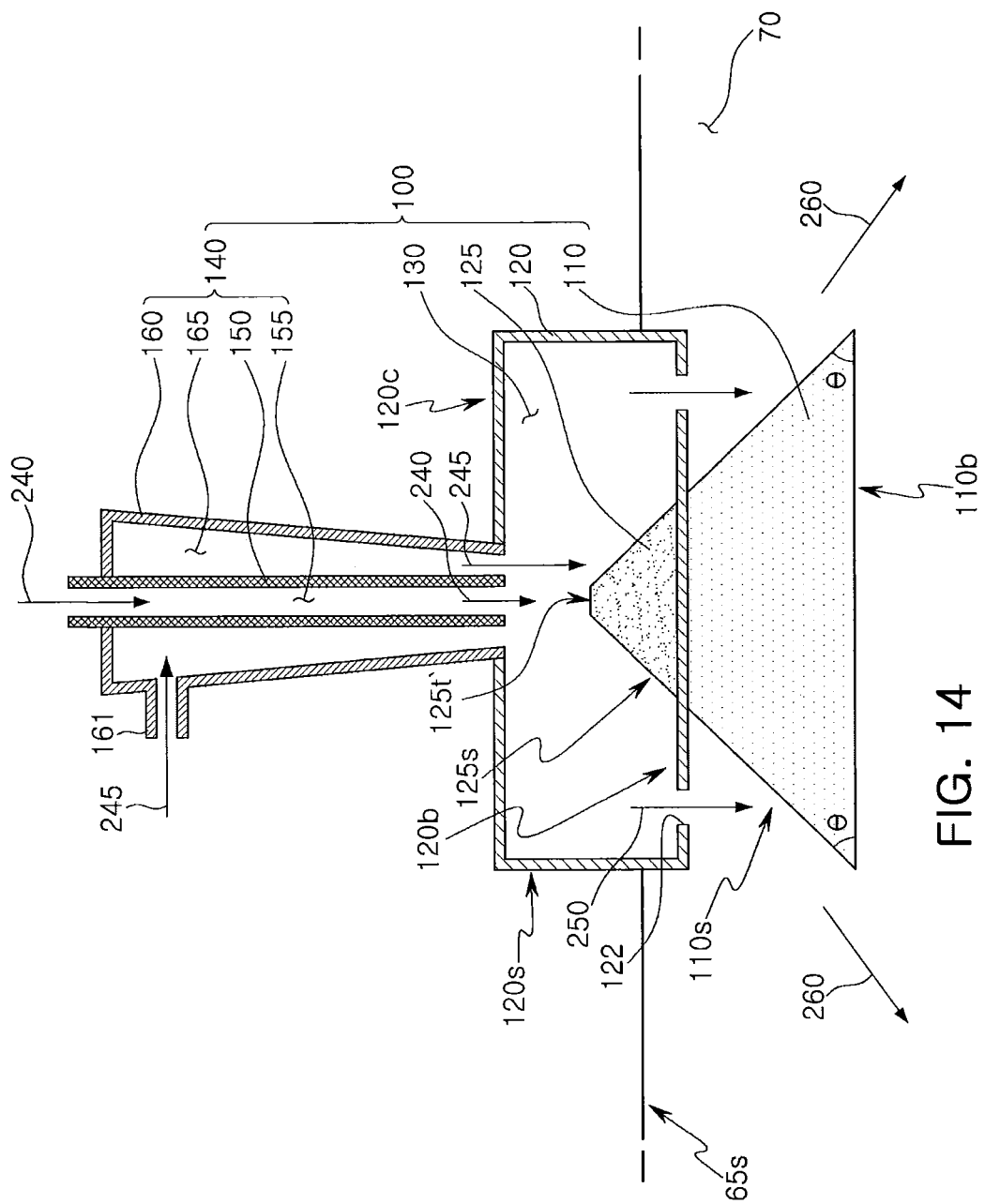
FIG. 14 is a cross-sectional view of a part of a substrate processing apparatus according to example embodiments.

Referring again to FIGS. 1, 2A, 2B, and 3, the inside dispersion block 125 may have a cone shape tapered in an upward direction from the bottom part 120b of the dispersion container 120 toward the ceiling part 120c of the dispersion container 120. Thus, the inside dispersion block 125 may have a sloped sidewall. As an example, the inside dispersion block 125 may have a sharp upper tip. However, the inventive concepts are not limited thereto. As an example, the upper tip of the inside dispersion block 125 may be disposed below the first inlet path 155, and a portion of the sidewall of the inside dispersion block 125 may be disposed below the second inlet path 165. Various modified examples of the inside dispersion block 125 will be described with reference to FIGS. 13 and 14. FIGS. 13 and 14 are cross-sectional views illustrating modified examples of the inside dispersion block 125.

Referring to FIG. 13, the inside dispersion block 125 may have a sloped sidewall 125s so as to have a width narrowing in the upward direction from the bottom part 120b of the dispersion container 120 and may have a curved or rounded upper tip 125t. For example, the upper tip 125t may be upwardly convex toward the gas inlet section 140.

Referring to FIG. 14, the inside dispersion block 125 may have the sloped sidewall 125s so as to have a width narrowing in the upward direction from the bottom part 120b of the dispersion container 120 toward the ceiling part 120c of the dispersion container 120 and may have a flat upper tip 125t'.

Referring again to FIGS. 1, 2A, 2B, and 3, the second inlet pipe 160 of the gas inlet section 140 of the gas distribution apparatus 100 may have a sloped sidewall so as to have a width or diameter decreasing approaching the dispersion container 120. For example, the second inlet pipe 160 may be gradually tapered inwardly from a top end thereof toward the dispersion container 120. However, the inventive concepts are not limited thereto.

Figure 15:
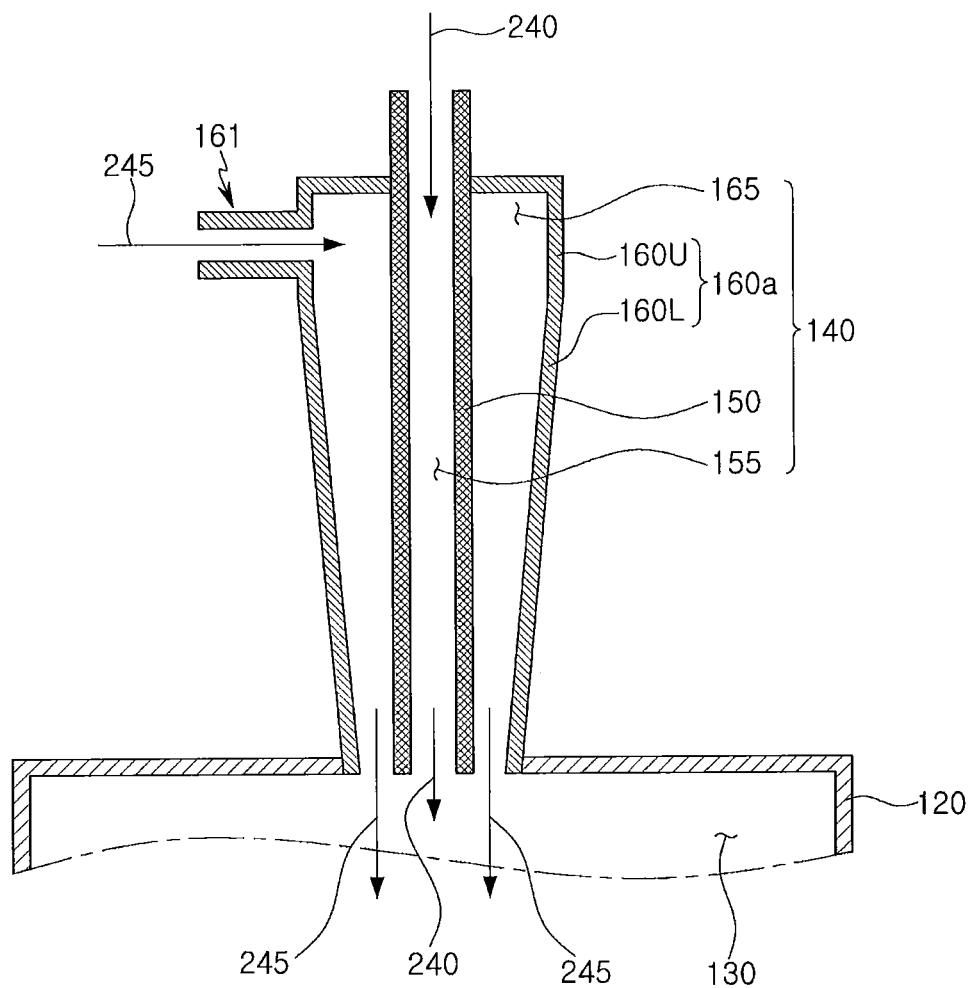
FIG. 15 is a cross-sectional view of a part of a substrate processing apparatus according to example embodiments.
Figure 16:
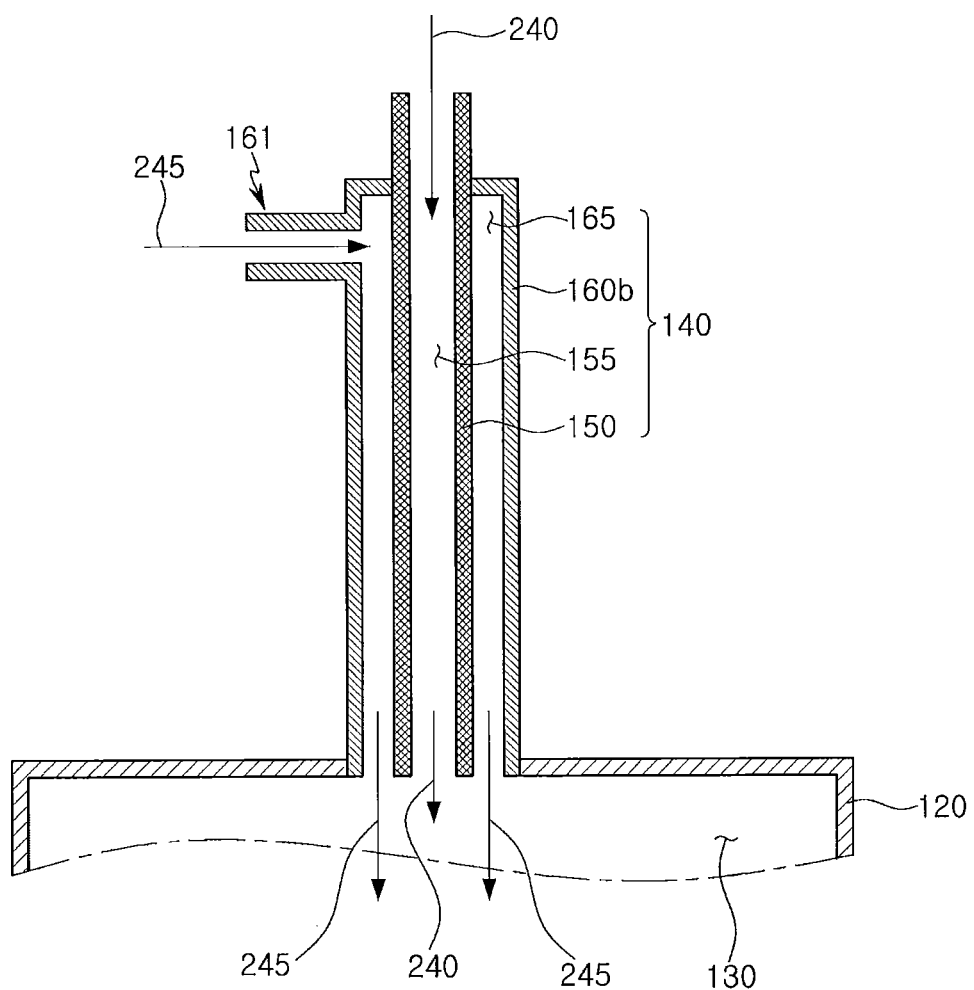
FIG. 16 is a cross-sectional view of a part of a substrate processing apparatus according to example embodiments.
Figure 17:
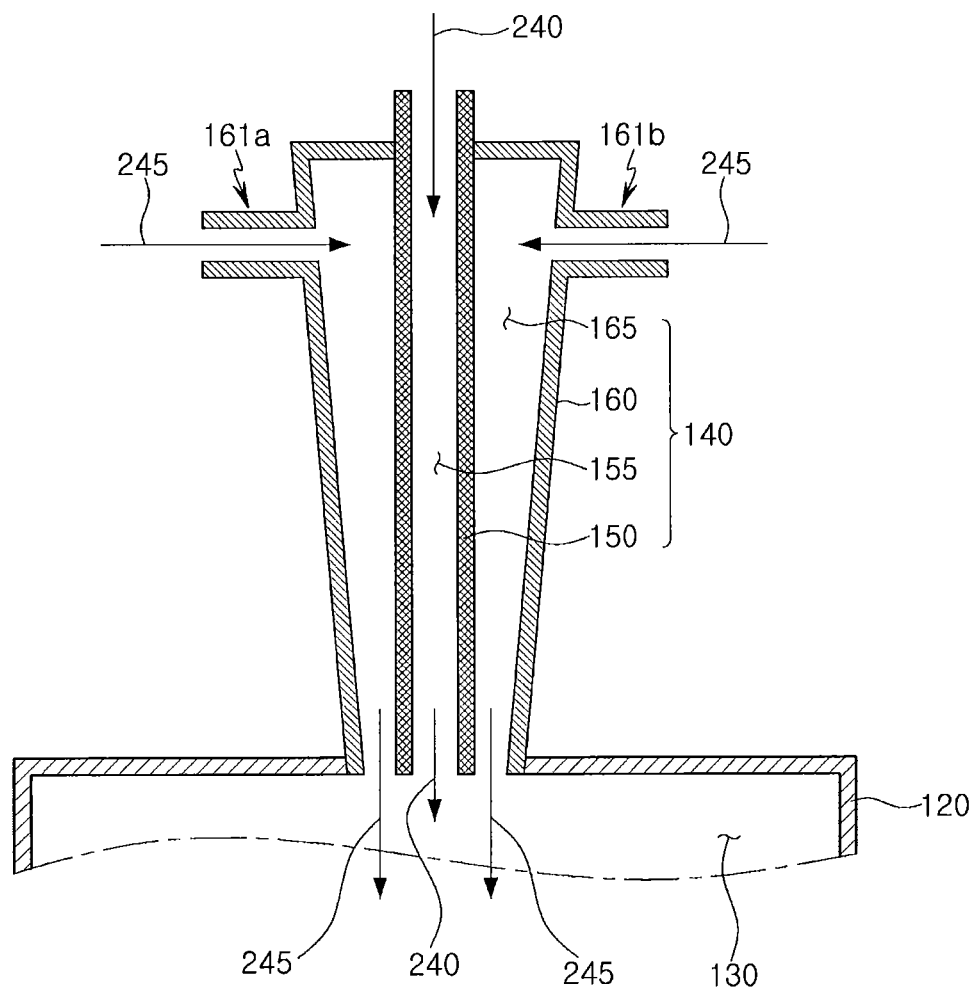
FIG. 17 is a cross-sectional view of a part of a substrate processing apparatus according to example embodiments.

FIGS. 15, 16, and 17 are cross-sectional views illustrating various modified examples of the gas inlet section 140 of the gas distribution apparatus 100.

Referring to FIG. 15, the gas inlet section 140 may be modified to include a second inlet pipe 160a including a lower part or portion 160L and an upper part or portion 160U above the lower part 160L. The lower part 160L of the second inlet pipe 160a may have a width or diameter increasing in an upward direction, and the upper part 160U thereof may have a substantially same or constant width or diameter in the upward direction. Thus, in the upper part 160U of the second inlet pipe 160a, the second inlet path 165 may have a substantially same width in a downward direction or in the upward direction.

In the lower part 160L of the second inlet pipe 160a, the second inlet path 165 may have a volume gradually decreasing in a downward direction from the upper part 160U toward the first dispersion space 130. The second connection part 161 described with reference to FIGS. 1, 2A, 2B, and 3 may be formed at the upper part 160U of the second inlet pipe 160a.

Referring to FIG. 16, the gas inlet section 140 may be modified to include a second inlet pipe 160b having a substantially same width in an extension direction of the second inlet pipe 160b. Thus, the second inlet pipe 160b may have a sidewall parallel to a sidewall of the first inlet pipe 150 and may surround the sidewall of the first inlet pipe 150.

Referring to FIG. 17, the gas inlet section 140 may be modified to include a plurality of second connection parts 161a and 161b formed at the upper part of the second inlet pipe 160.

Figure 18:
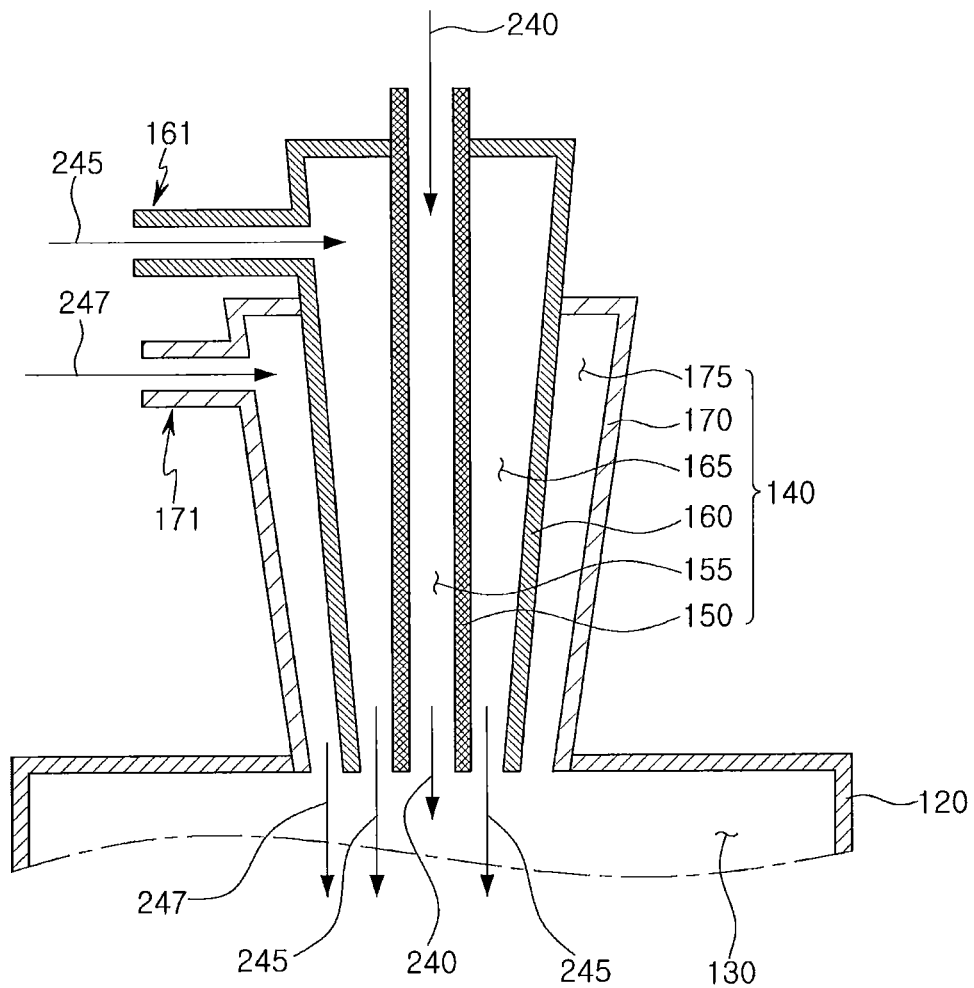
FIG. 18 is a cross-sectional view of a part of a substrate processing apparatus according to example embodiments.

Referring to FIG. 18, the gas inlet section 140 may include the aforementioned first inlet pipe 150, the aforementioned second inlet pipe 160, and a third inlet pipe 170 surrounding at least a portion of a sidewall of the second inlet pipe 160. The third inlet pipe 170 may have a sloped sidewall. The third inlet pipe 170 may include a connection part 171 formed at an upper part or portion of the third inlet pipe 170. A third inlet gas 247 may be introduced into a third inlet path 175 in the third inlet pipe 170 through the connection part 171.

The gas distribution apparatus 100 according to example embodiments may include the dispersion container 120 including the first dispersion space 130, the gas inlet section 140 including the first inlet pipe 150 disposed over the dispersion container 120 and a second inlet pipe 160 surrounding at least a portion of the sidewall of the first inlet pipe 150, and the dispersion block connected to the bottom part 120b of the dispersion container 120. The first inlet pipe 150 may include the first inlet path 155 through which the first inlet gas 240 passes, The second inlet pipe 160 may include the second inlet path 165 through which the second inlet gas 245 passes. At least a portion of the sidewall of the dispersion block may be inclined with respect to the bottom part 120b of the dispersion container 120.

The dispersion block may include the inside dispersion block 125 above the bottom part 120b of the dispersion container 120 and below the first and second inlet paths 155 and 165 and/or the outside dispersion block 110 below the bottom part 120b of the dispersion container 120 and having the sidewall overlapped or aligned with the dispersion holes 122.

When the semiconductor fabrication process is performed on the semiconductor substrate 5, the substrate processing apparatus 1 including gas distribution apparatus 100 may uniformly spray the process gas into the processing space 30. For example, the first and second inlet gases 240 and 245 being used as the process gas may be uniformly introduced in the processing space 30 through the gas distribution apparatus 100 and the shower head structure 50 and may be provided to the semiconductor substrate 5 to perform the semiconductor fabrication process. According to example embodiments, the process distribution characteristics of the semiconductor fabrication process may be improved.

While the present inventive concepts have been particularly shown and described with reference to example embodiments thereof, it will be understood by those of ordinary skill in the art that various changes in form and details may be made therein without departing from the spirit and scope of the present disclosure as defined by the following claims.

What is claimed is:
1. A substrate processing apparatus comprising:
a substrate chuck;
a shower head structure over the substrate chuck; and
a gas distribution apparatus connected to the shower head structure,
wherein the gas distribution apparatus includes a dispersion container including a first dispersion space and a gas inlet section on the dispersion container,
wherein the gas inlet section includes a first inlet pipe including a first inlet path fluidly connected to the first dispersion space and a second inlet pipe including a second inlet path fluidly connected to the first dispersion space; and
wherein the second inlet pipe surrounds at least a portion of a sidewall of the first inlet pipe.

2. The apparatus of claim 1, wherein the shower head structure includes a second dispersion space in communication with the first dispersion space, a plate section under the second dispersion space, and a plurality of through holes penetrating the plate section and in communication with the second dispersion space.

3. The apparatus of claim 1, wherein the second inlet path includes a portion having a width increasing in a direction extending away from the first dispersion space.

4. The apparatus of claim 1, wherein the second inlet pipe includes a lower portion adjacent the first dispersion space and an upper portion remote from the first dispersion space, and
wherein a width of the upper portion of the second inlet pipe is greater than a width of the lower portion of the second inlet pipe.

5. The apparatus of claim 1, wherein the gas distribution apparatus further includes an inside dispersion block above a bottom portion of the dispersion container.

6. The apparatus of claim 5, wherein the inside dispersion block tapers inwardly in an upward direction from the bottom portion of the dispersion container.

7. The apparatus of claim 5, wherein an upper tip of the inside dispersion block is sharp, curved, or planar.

8. The apparatus of claim 5, wherein an upper tip of the inside dispersion block is disposed below the first inlet path, and
wherein a portion of a sidewall of the inside dispersion block is disposed below the second inlet path.

9. The apparatus of claim 5, wherein the gas distribution apparatus further includes an outside dispersion block below the bottom portion of the dispersion container,
wherein the dispersion container further includes a plurality of dispersion holes penetrating the bottom portion of the dispersion container around the inside dispersion block and in communication with the first dispersion space, and
wherein at least a portion of a sidewall of the outside dispersion block is below the plurality of dispersion holes.

10. The apparatus of claim 9, wherein the sidewall of the outside dispersion block is sloped to define an acute angle with the bottom portion of the dispersion container.

11. The apparatus of claim 9, wherein at least a portion of the sidewall of the outside dispersion block is convex or concave.

12. The apparatus of claim 9, wherein the sidewall of the outside dispersion block includes a first sidewall portion and a second sidewall portion that are sloped at different angles relative to the bottom portion of the dispersion container.

13. The apparatus of claim 12, wherein a boundary between the first sidewall portion of the outside dispersion block and the second sidewall portion of the outside dispersion block is positioned below the plurality of dispersion holes.

14. The apparatus of claim 12, wherein the plurality of dispersion holes include a plurality of first dispersion holes and a plurality of second dispersion holes, wherein the first sidewall portion of the outside dispersion block is positioned below the plurality of first dispersion holes, and wherein the second sidewall portion of the outside dispersion block is positioned below the plurality of second dispersion holes.

15. A substrate processing apparatus comprising:

a substrate chuck configured to support a substrate;

a shower head above the substrate chuck;

a processing space between the shower head and the substrate chuck; and a gas distribution apparatus connected to the shower head and including a first dispersion space, wherein the shower head includes a second dispersion space in communication with the first dispersion space and having a volume greater than the first dispersion space, a plate under the second dispersion space, and a plurality of through holes penetrating the plate and fluidly connecting the second dispersion space and the processing space, wherein the gas distribution apparatus includes a dispersion container including the first dispersion space therein, a gas inlet section above the dispersion container, and a dispersion block connected to the dispersion container, wherein the gas inlet section includes a first inlet pipe including a first inlet path therein and a second inlet pipe including a second inlet path therein, and wherein at least a portion of a sidewall of the dispersion block is sloped with respect to a bottom wall of the dispersion container.

16. The apparatus of claim 15, wherein the dispersion container includes the bottom wall, a side wall, and a ceiling that define the first dispersion space, and a plurality of dispersion holes penetrating the bottom wall, wherein the dispersion block includes an inside dispersion block above the bottom wall of the dispersion container and/or an outside dispersion block below the bottom wall of the dispersion container and having a sidewall vertically aligned with the plurality of dispersion holes.

17. The apparatus of claim 16, wherein the inside dispersion block has a width gradually decreasing in a direction extending from the bottom wall of the dispersion container toward the ceiling of the dispersion container.

18. The apparatus of claim 15, wherein the second inlet pipe surrounds at least a portion of a sidewall of the first inlet pipe, and wherein the first and second inlet paths are in communication with the first dispersion space.

19. A semiconductor fabrication process comprising:

mounting a semiconductor substrate on a substrate chuck; and providing a process gas to the semiconductor substrate through a gas distribution apparatus above the substrate chuck, wherein the gas distribution apparatus includes a dispersion container, a gas inlet section above the dispersion container, and a dispersion block connected to a bottom wall of the dispersion container and having a sidewall sloped with respect to the bottom wall of the dispersion container, and wherein the gas inlet section includes a first inlet pipe including a first inlet path through which a first inlet gas passes and a second inlet pipe including a second inlet path through which a second inlet gas passes.

20. The process of claim 19, wherein the dispersion container includes the bottom wall, a side wall, and a ceiling that define a dispersion space, and a plurality of dispersion holes penetrating the bottom wall, wherein the gas inlet section is connected to the ceiling of the dispersion container, wherein the first and second inlet paths are in communication with the dispersion space, wherein the second inlet pipe surrounds at least a portion of a sidewall of the first inlet pipe, and wherein the dispersion block includes an inside dispersion block above the bottom wall of the dispersion container and/or an outside dispersion block below the bottom wall of the dispersion container.

* * * * *